United States Patent [19]

Grindahl et al.

[11] Patent Number: 4,786,903

[45] Date of Patent: Nov. 22, 1988

[54] REMOTELY INTERROGATED TRANSPONDER

[75] Inventors: Mervin L. Grindahl, Waseca; George Rosar, Owatonna; Mark Kodet, Waseca, all of Minn.

[73] Assignee: E. F. Johnson Company, Waseca, Minn.

[21] Appl. No.: 58,636

[22] Filed: Jun. 1, 1987

Related U.S. Application Data

[63] Continuation of Ser. No. 852,154, Apr. 15, 1986, abandoned.

[51] Int. Cl.⁴ .......................... H04Q 7/00; H03B 5/12

[52] U.S. Cl. ....................... 340/825.540; 331/117 FE

[58] Field of Search ....................... 340/825.54, 870.26; 342/44, 51, 50; 455/73, 83, 85–87, 336; 331/112, 117 FE, 149, 153, 173, 174, 115, 177 V; 375/62, 63, 65, 74

[56] References Cited

U.S. PATENT DOCUMENTS

| | | | |
|---|---|---|---|
| 3,750,167 | 7/1973 | Gehman et al. | 342/44 |
| 3,918,057 | 11/1975 | Van Tol | 342/51 |
| 4,085,364 | 4/1978 | Kakigi | 455/86 |
| 4,511,861 | 4/1985 | Bell | 331/117 FE |
| 4,614,945 | 9/1986 | Brunius | 340/870.03 |
| 4,616,193 | 10/1986 | Meyer | 331/117 FE |
| 4,660,002 | 4/1987 | Iijima et al. | 331/177 V |
| 4,670,722 | 6/1987 | Rauscher | 331/117 FE |
| 4,684,904 | 8/1987 | Watkins et al. | 331/177 V |

FOREIGN PATENT DOCUMENTS

| | | | |
|---|---|---|---|
| 2416593 | 10/1979 | France | 455/86 |

*Primary Examiner*—Donald J. Yusko

*Attorney, Agent, or Firm*—Dorsey & Whitney

[57] ABSTRACT

A radio frequency transponder is provided that combines high signal sensitivity in the receive mode and variable frequency capability in the transmit mode in a low component and power efficient design. A single tuned amplifier acts as the externally quenched oscillator of a superregenerative receiver when the transponder is operated in the receive mode, and as the carrier frequency generator when the transponder is operated in the transmit mode.

16 Claims, 2 Drawing Sheets

REMOTELY INTERROGATED TRANSPONDER

This application is a continuation of application Ser. No. 06/852,154 filed Apr. 15, 1986 and abandoned.

CROSS REFERENCE TO RELATED APPLICATION

This application is related to copending U.S. patent applications entited "Automatic/Remote RF Instrument Reading Method and Apparatus", Ser. No. 703,621, filed Feb. 20, 1985 now U.S. Pat. No. 4,614,945, and "Improved Automatic/Remote RF Instrument Monitoring System", Ser. No. 839,889, filed Mar. 14, 1986.

TECHNICAL FIELD

This invention relates to a remotely interrogated radio frequency transponder. In particular, it relates to a radio frequency transponder incorporating a superregenerative receiver and frequency shiftable transmitter based upon a single, shared oscillator circuit.

BACKGROUND OF THE INVENTION

The two above identified patent applications describe systems for remotely and automatically reading a plurality of individual gas, water, or similar meters from a single, mobile meter reading transceiver, the disclosures of both patent applications being incorporated herein by reference. The systems described in the referenced applications require radio frequency transponders that can be attached to individual, respective meters for accumulating customer use data from the meter, and transmitting the customer use data to a mobile transceiver on demand.

A radio frequency transponder suitable for use in an automatic, remote meter reading system must have an independent power source, must have extremely low power requirements to conserve the power source over a number of years, must be able to continuously monitor for an interrogation signal, and must be able to transmit data in response to the receipt of an interrogation signal. Moreover, the cost of each individual transponder must be minimized, since each customer meter in a municipal water, gas, or similar distribution system, must be provided with its own individual transponder.

SUMMARY OF THE INVENTION

The remotely interrogated transponder in accordance with the present invention is particularly suited for use in a remote, automatic meter reading system as is disclosed in the above referenced patent applications. The transponder hereof combines high signal sensitivity in the receive mode and variable frequency capability in the transmit mode in a low component and power efficient design. A single tuned amplifier acts as the externally quenched oscillator of a superregenerative receiver when the transponder is operated in the receive mode, and as the carrier frequency generator when the transponder is operated in the transmit mode. The radio frequency energy in the oscillator is sampled by a detector diode to determine the presence of an externally generated interrogation signal. The resonant frequency of the oscillator tuned tank can be shifted from a predetermined receive frequency to a predetermined transmit frequency by selectively switching additional capacitance into the tank circuit.

Figure 1:
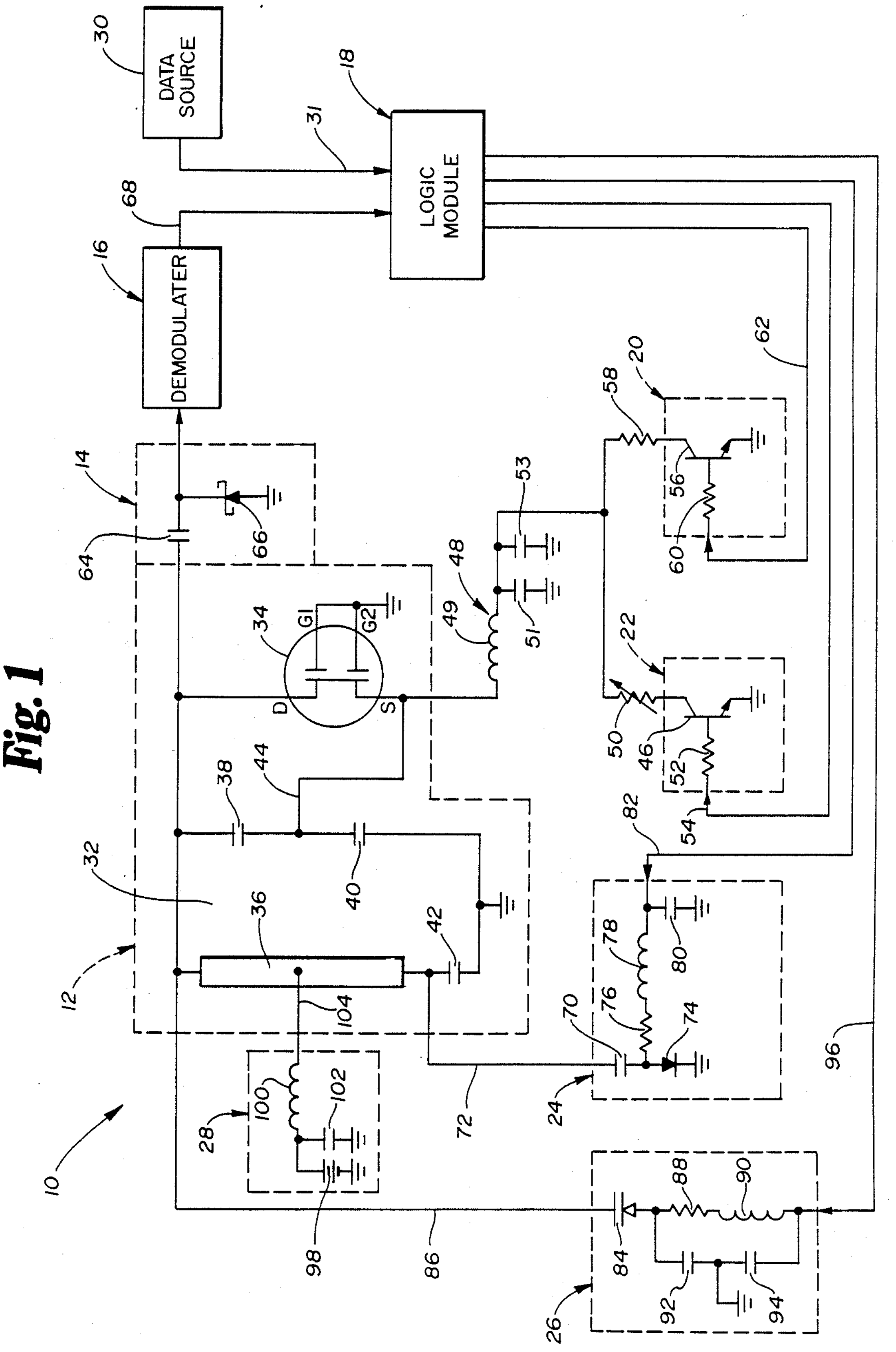
FIG. 1 is a schematic diagram of a remotely interrogated transponder in accordance with the present invention. at different sample points in the transponder.

FIGS. *2a-d* are schematic representations of signal waveforms at different sample points in the transponder.

DETAILED DESCRIPTION OF THE DRAWINGS

Referring to the drawing, a remotely interrogated transponder 10 in accordance with the present invention broadly includes oscillator circuit 12, detector 14, demodulator 16, logic module 18, data modulator 20, external quenching circuit 22, course transmit frequency adjust circuit 24, fine transmit frequency adjust circuit 26, and power source 28. Data source 30 provides data to logic module 18 via lead 31.

Oscillator circuit 12 comprises a Colpitts oscillator including a parallel tuned tank load 32 capacitively fed back to amplifying transistor 34. The tuned tank 32 is advantageously comprised of a shortened half wavelength section of microstrip 36. The capacitive load of the tank 32 is primarily split between series capacitors 38 and 40. A third capacitor 42 is also included, in series with capacitors 38 and 40. As will appreciated by those skilled in the art, the inductive value of the microstrip 36, and the values of the individual capacitors 38, 40, 42 may be selected such that tank 32 resonates at a predetermined frequency.

Transistor 34 is an N-channel GaAs dual-gate MES field effect transistor (NE41137) manufactured by NEC Corporation of Santa Clara, Calif. Tuned tank 32 is coupled to the drain of transistor 34 as a tuned load, with capacitive feedback provided to the source of transistor 34 via line 44. The dual gates of transistor 34 are coupled to ground. It will be understood that transistor 34 is designed to conduct less as the gate voltage is made more negative with respect to the source.

External quench circuit 22 comprises NPN bipolar junction switching transistor 46. Switching transistor 46 is connected to the source of oscillator transistor 34 via filter network 48, comprised of choke 49, filtering capacitor 51, and data pulse wave shaping capacitor 53, and variable resistor 50. Switching transistor 46 is connected to logic module 18 via base current limiting resistor 52, and lead 54.

Data modulator 20 comprises NPN, bipolar junction switching transistor 56. Switching transistor 56 is connected to the source of oscillator transistor 34 via filter network 48 and resistor 58 and is connected to logic module 18 via current limiting base resistor 60 and lead 62.

Detector 14 comprises coupling capacitor 64 and rectifying hot carrier or Schottky diode 66. The output of rectifying diode 66 is provided to demodulator 16, which in turn provides a receive detect signal to the logic module 16 via lead 68.

Course transmit frequency adjustment circuit 24 includes tuning capacitor 70 connected to tuned tank 32 via lead 72, and enabling pin diode 74. Current limiting resistor 76, choke 78, and filtering capacitor 80 connect the anode of course frequency adjustment circuit enabling pin diode 74 to logic module 18 via lead 82.

Fine transmit frequency adjustment circuit 26 comprises varactor diode 84 connected to tuned tank 32 via lead 86. The anode of varactor diode 84 is connected to logic module 18 via current limiting resistor 88, choke 90, filtering capacitors 92, 94, and lead 96.

Power source 28 includes DC battery 98, choke 100, and filtering capacitor 102. The power source 28 is connected to the midpoint of half wavelength microstrip 36 via lead 104.

The values of the various components in transponder 10, as described above, can be preselected such that the transponder 10 can transmit and receive at various preselected frequencies. Preferred component values such that transponder 10 is capable of receiving frequencies at 952 megahertz, and transmitting at frequencies between 910 and 920 megahertz, are listed in Table 1.

Figure 2A:
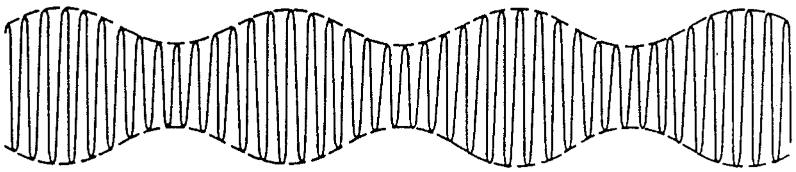

When operated in the receive mode, transponder 10 functions as a superregenerative receiver. An amplitude modulated, remotely transmitted signal, having a waveform as depicted in FIG. 2*a*, is presented to the inductive microstrip 36 of tuned tank 32, the microstrip serving the dual function of a receive antenna and the inductive leg of tuned tank 32. The anodes of diode 74 and varactor 84 are biased low by a signal from logic module 18, when the transponder 10 is to be operated in the receive mode, so that only capacitors 38, 40 and 42 make up the capactive leg of the tuned tank 32.

Those skilled in the art will realize that, if transistor 34 were left continuously on, while the transponder 10 were operated in the receive mode, oscillator circuit 14 would oscillate continuously at the resonant frequency of tuned tank 32, making it impossible to recover the modulated information from the transmttted signal. Accordingly, external quench circuit 22 is provided to periodically turn off transistor 34, allowing the oscillations in tuned tank 32 to die out.

Figure 2B:
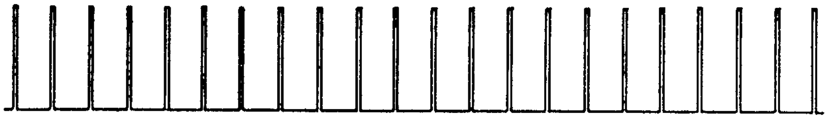

In particular, when switching transistor 46 is turned on, a ground return path is provided through resistor 50 for current flowing through the oscillator transister 34. When the switching transistor 46 turns off, the ground return path for oscillator transistor 34 is disabled, and transistor 34 is turned off. Switching transistor 34 is controlled by logic module 18. In the particular embodiment shown, the switching transistor 46 is turned on for 1 microsecond every 22 miliseconds, providing an enable duty cycle to transistor 34 of 0.05%. As can be appreciated from the above description, the external quench crcuit 22 in the embodiment described pulses transistor 34 at an operating cycle of 512 hertz frequency, the operating cycle waveform being depicted in FIG. 2*b*.

Figure 2C:
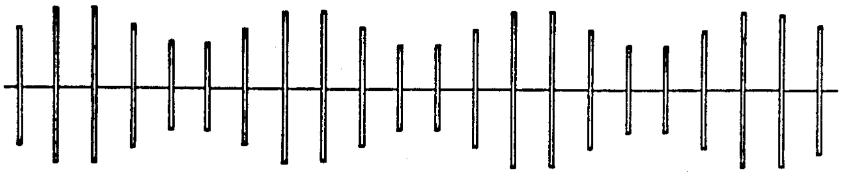

Oscillations at the resonate frequency will build up in tank 32 each time transistor 34 is turned on, whether or not a remotely generated signal is presented to the circuit. The presence of an externally generated signal, alternating at the resonant frequency of tuned tank 32, will cause oscillations within the tuned tank 32 to build up faster than they otherwise would. When the externally generated signal is amplitude modulated, the amplitude of the received signal will additionally have an effect on the rate at which oscillations build up in the tuned tank 32. The presence of an amplitude modulated externally generated signal presented to the tuned tank 32, together with the external quenching of the circuit as provided by quench circuit 22, will result in a pulse amplitude modulated signal being presented to the detector 14, having a waveform similar to that depicted in FIG. 2*c*.

Figure 2D:
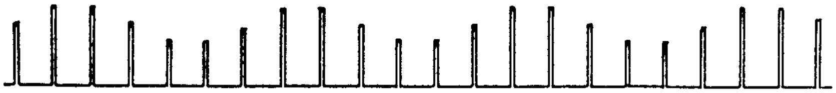

The amplitude of the individual pulses will be a function of how fast oscillations build up in the tuned tank each time the quench circuit 22 turns on transistor 34. In this regard, it will be appreciated that the transistor 34 must be turned off long enough, each quench cycle, for the oscillations in the tuned tank 32 to reduce to near zero. With the oscillations reduced to near zero each quench cycle, the amplitude of the next pulse, as presented to detector 14, will be directly related to the amount of externally generated energy presented to tank 32; that is to say, the amplitude of each pulse will be a function of the degree of modulation of the amplitude modulated, externally generated signal. The diode 66 of detector 14 providss a rectified, pulse amplitude modulated pulse train (FIG. 2*d*) to demodulator 16. Demodulator 16 filters out the pulse frequency to present only the modulated waveform to logic module 18.

Logic module 18 is programmed to recognize a specific demodulated signal. For instance, the carrier frequency of the externally generated signal presented to the antenna/inductive leg 36 of tuned tank 32 can be modulated with a particular low frequency signal (as indicated by the dashed lines in the waveform of FIG. 2*a*). The logic module 18 is programmed to react to the presence of the demodulated low frequency signal to configure the transponder 10 in the transmit mode, such that the transponder 10 transmits the data accumulated by data source 30.

In particular, in the instance of a remote, automatic meter reading system, a mobile transceiver transmits an amplitude modulated signal, which would be received and demodulated by the transponder 10 when the mobile transceiver came into proximity with the transponder 10. Upon detection of the mobile tranceiver's signal, the transponder 10, at the direction of logic module 18, is switched to the transmit mode, and transmits the data received from the data source. The data would comprise customer use data as compiled by a gas, water or other meter.

The transponder 10 is reconfigured from the receive mode to the transmit mode in the following manner. Upon detection of the predetermined signal, logic module 18 presents a high logic level on lead 82 to the course transmit frequency adjust circuit 24. The presence of a high logic level at the anode of diode 74 causes the diode 74 to conduct, which in turn places capacitor 70 in parallel with capacitor 42 of tuned tank 32. The change in the capacitive leg of tuned tank 32 shifts the resonant frequency of the tuned tank 32, causing oscillator circuit 12 to oscillate at a new frequency.

Logic module 18 also presents a logic low signal to external quench circuit 22, when shifting transponder 10 to the transmit mode, turning off switching transistor 46, and effectively shifting control of the operating cycle of transistor 34 to the data modulator 20. The data presented by data source 30 is formatted by logic module 18 in serial, binary format. The serially formatted binary information is presented by logic module 18 to data modulator 20 via lead 62 in a series of logic high and logic low signals. Switching transistor 56 of data modulator 20 is accordingly switched on and off, thereby turning oscillator transistor 34 on and off as a function of the data stream presented to the data modulator 20. When the transistor 34 is turned on, in the above described manner, the oscillator circuit 12 will oscillate at the resonant frequency of the tuned tank 32 as determined by the tank capacitors 38, 40, 42, and the course frequency transmit frequency adjustment capacitor 70. The inductive microstrip 36 will act as an antenna, radiating energy at the oscillator frequency.

The capacitance presented by varactor diode 84 of fine transmit frequency adjustment circuit 26 is directly related to the amount of biasing voltage presented to the anode of the varactor 84. Logic module 18 can be programmed to present varying bias voltages, via lead 96, to the anode of varactor diode 84. Because varactor 84 is tied by lead 86 to tuned tank 32, it will be understood that the capacitive leg of the tuned tank 32, and therefore the resonant frequency of the tank 32, can be adjusted by adjusting the biasing voltage at the anode of varactor 84.

As will be appreciated from the above description, transponder 10 can be programmed to transmit serially encoded data at a predetermined transmit frequency in response to the reception, by the transponder 10, of an interrogation signal at a different, preselected receive frequency. It will be appreciated that a single, shared oscillator circuit used as a superregenerative receiver and transmit frequency generator can be used in other applications where a power efficient and low component transponder design is required.

TABLE 1

CIRCUIT VALUES FOR FIG. 1

| | | | |
|---|---|---|---|
| 34 | NE41137 | 78 | quarter wave microstrip |
| 36 | shortened half wave length | 80 | 33 pf |
| 38 | 3.3 pf | 84 | MMBV105 |
| 40 | 3.3 pf | 90 | quarter wave microstrip |
| 42 | 2.7 pf | 92 | 2 pf |
| 46 | MMBT4401 | 94 | 33 pf |
| 49 | quarter wave microstrip | 100 | quarter wave microstrip |
| 50 | 500 ohms | 102 | 33 pf |
| 51 | 33 pf | | |
| 53 | .01 mf | | |
| 56 | MMBT4401 | | |
| 58 | 360 ohms | | |
| 64 | 3.3 pf | | |
| 66 | MMBD501 | | |
| 70 | 2 pf | | |
| 74 | MMBV3401 | | |

I claim:

1. A radio frequency transponder for receiving an externally generated signal at first carrier frequency, said externally generated signal being amplitude modulated in accordance with an interrogation signal, and for transmitting a data signal at a second carrier frequency in response to receipt of said interrogation signal, comprising:

an oscillator circuit including means for producing radio frequency oscillations at said first carrier frequency, said oscillator circuit including means for receiving said externally generated signal;

quenching circuit means operably coupled to said oscillator circuit for periodically quenching the amplitude of said oscillations in said oscillator circuit;

sampling means operably coupled to said oscillator circuit for sampling said oscillations in said oscillator circuit and providing a sampling means output in response to the receipt of said externally generated signal by said oscillator circuit;

tuning circuit means operably coupled to said oscillator circuit for selectively changing the resonant frequency of said oscillator circuit between said first frequency and said second frequency; and switching means operably coupled to said sampling means and said tuning ciruit means for selectively activating said tuning circuit in response to receipt of said sampling means output whereby said oscillator circuit resonant frequency is shifted from said first frequency to said second frequency in response to receipt of said externally generated signal by said transponder.

2. A circuit as claimed in claim 1, said sampling means including a detector circuit means operably coupled to said oscillator circuit for detecting said externally generated signal and providing a detector output comprising said interrogation signal.

3. A circuit as claimed in claim 2, said sampling means including a demodulator means operably coupled to said detector circuit means and said switching means for receiving said detector output and presenting a demodulator output to said switching means in response to receipt of said interrogation signal.

4. A circuit as claimed in claim 2, said detector circuit means including a rectifying element.

5. A circuit as claimed in claim 1, including a modulator means operably coupled to said oscillator circuit for modulating said amplitude of said oscillations in said oscillatior circuit to produce a data signal.

6. A circuit as claimed in claim 5, said modulator means being operably coupled to said switching means whereby said modulator means is activated in response to said interrogation signal.

7. A circuit as claimed in claim 6, said modulator means including a modulator switch for selectively interrupting said oscillations to produce said data signal.

8. A circuit as claimed in claim 7, said oscillator circuit including an amplifying transistor, said modulator switch operably coupled to said amplifying transistor whereby said modulator means selectively energizes said amplifying transistor to produce said data signal.

9. A circuit as claimed in claim 7, said modulator switch comprising a transistor.

10. A circuit as claimed in claim 8, said amplifying transistor comprising a GaAs field effect transistor.

11. A circuit as claimed in claim 1, said tuning means comprising a coarse frequency tuning means for producing large changes in the resonant frequency of said oscillator circuit operably coupled to said switching means, and a fine frequency tuning means operably coupled to said switching means for producing incremental changes in the resonant frequency of said oscillator circuit, said incremental changes being smaller than said large changes.

12. A circuit as claimed in claim 11, said coarse frequency tuning means including a reactive element and a switching diode operably coupled to said switching means whereby said reactive element is selectively operably coupled to said oscillator circuit in response to receipt of said externally generated signal by said transponder.

13. A circuit as claimed in claim 11, said fine frequency tuning means comprising a varactor.

14. A circuit as claimed in claim 1, said oscillator circuit comprising a Colpitts oscillator.

15. A circuit as claimed in claim 1, said oscillator circuit including an amplifying element, said amplifying element comprising a GaAs field effect transistor.

16. A circuit as claimed in claim 1, said quenching means comprising a transistor.

* * * * *

UNITED STATES PATENT AND TRADEMARK OFFICE
CERTIFICATE OF CORRECTION

PATENT NO. : 4,786,903

DATED : November 22, 1988

INVENTOR(S) : Mervin L. Grindahl et al.

It is certified that error appears in the above-identified patent and that said Letters Patent is hereby corrected as shown below:

Column 2, line 5, delete the words "at different sample points in the transponder".

Column 3, line 24, delete the word "capactive" and substitute therefor --capacitive--.

Column 3, line 30, delete the word "transmttted" and substitute therefor --transmitted--.

Column 3, line 36, delete the word "transister" and substiute therefor --transistor--.

Column 3, line 42, delete the word "miliseconds" and substitute therefor --milliseconds--.

Column 4, line 11, delete the word "providss" and substitute therefor --provides--.

Signed and Sealed this

Ninth Day of May, 1989

*Attest:*

DONALD J. QUIGG

*Attesting Officer* — *Commissioner of Patents and Trademarks*